United States Patent [19]

Ehrfeld et al.

[11] Patent Number: 4,872,888
[45] Date of Patent: Oct. 10, 1989

[54] MICROPOROUS MEMBRANE FILTER AND METHOD OF PRODUCING SAME

[75] Inventors: Wolfgang Ehrfeld, Karlsruhe; Peter Hagmann, Eggenstein-Leopoldshagen; Jürgen Mohr, Sulzfeld; Dietrich Münchmeyer, Stutensee, all of Fed. Rep. of Germany

[73] Assignee: Kernforschungszentrum Karlsruhe GmbH, Karlsruhe, Fed. Rep. of Germany

[21] Appl. No.: 154,298

[22] Filed: Feb. 11, 1988

[30] Foreign Application Priority Data

Feb. 13, 1987 [DE] Fed. Rep. of Germany ....... 3704546

[51] Int. Cl.$^4$ ............... B01D 39/16; B01D 59/14; C08J 9/26; B29C 67/20
[52] U.S. Cl. ........................................ 55/16; 55/522; 55/529; 55/DIG. 42; 264/22; 264/49; 264/219; 264/344; 264/DIG. 48
[58] Field of Search ........... 264/22, 49, 344, DIG. 48, 264/219; 55/16, 522, 529, DIG. 42

[56] References Cited

U.S. PATENT DOCUMENTS

| 3,438,504 | 4/1969 | Furman | 264/22 X |
|---|---|---|---|
| 3,846,521 | 11/1974 | Osterholtz | 264/22 |
| 3,992,495 | 11/1976 | Sano et al. | 264/22 |
| 4,046,843 | 9/1977 | Sano et al. | 264/22 |
| 4,107,049 | 8/1978 | Sano et al. | 264/22 X |
| 4,147,745 | 4/1979 | Sano et al. | 264/22 |
| 4,163,725 | 8/1979 | Sano et al. | 264/22 X |
| 4,265,959 | 5/1981 | Sano et al. | 264/22 X |
| 4,268,662 | 5/1981 | Sano et al. | 264/22 X |
| 4,283,359 | 8/1981 | Tsutsui et al. | 264/22 |
| 4,330,406 | 5/1982 | Sano et al. | 264/22 X |
| 4,347,139 | 8/1982 | Hayashi | 264/22 X |
| 4,353,799 | 10/1982 | Leonard | 264/22 X |
| 4,356,215 | 10/1982 | Auriol et al. | 264/49 X |
| 4,430,278 | 2/1984 | Jones, Sr. | 264/22 |
| 4,457,817 | 7/1984 | Bobeth et al. | 264/22 X |
| 4,514,345 | 4/1985 | Johnson et al. | 264/22 |
| 4,517,142 | 5/1985 | Baniel | 264/22 |
| 4,548,769 | 10/1985 | Shimomura et al. | 264/22 |
| 4,655,797 | 4/1987 | Iniotakis et al. | 55/16 |

FOREIGN PATENT DOCUMENTS

| 2440081 | 7/1982 | Fed. Rep. of Germany . |
|---|---|---|
| 3332345 | 3/1985 | Fed. Rep. of Germany . |
| 3546328 | 7/1986 | Fed. Rep. of Germany . |
| 0238467 | 8/2086 | German Democratic Rep. . |

Primary Examiner—Philip Anderson
Attorney, Agent, or Firm—Spencer & Frank

[57] ABSTRACT

A process for producing a filter including a microporous membrane and a supporting structure connected thereto, including producing a mold for the membrane and the supporting structure, filling the mold with a molding material whose solubility can be changed by high energy radiation, and forming the micropores by partial irradiation of the membrane with high energy radiation and removal of the regions having increased solubility. The filter produced according to the above method is a unitary structure with the supporting structure integrally connected to the membrane.

9 Claims, 2 Drawing Sheets

MICROPOROUS MEMBRANE FILTER AND METHOD OF PRODUCING SAME

BACKGROUND OF THE INVENTION

The present invention relates to a method for producing a filter including a microporous membrane having a supporting structure connected thereto, as well as to a filter produced according to this method.

Federal Republic of Germany DE-OS No. 3,332,345, corresponding to U.S. Pat. No. 4,655,797, discloses a fine screen in the form of a coated metal fabric in which the coating is formed by a galvanic or chemical metal deposition which reduces the width of the screen mesh. In such fine screens, the retention capability or filter gauge, respectively, can be controlled by monitoring the deposition and, without difficulty to the mesh down into regions around 0.01 $\mu$m, to set the openings at a defined width. However, with the reduction in mesh width, the transparency or porosity of the fine screen drops as well.

Federal Republic of Germany DE-OS No. 2,440,081, corresponding to U.S. Pat. No. 4,356,215 discloses a filter which includes a macroporous carrier whose pore diameter is about 15 to 20 microns. This carrier is successively coated with two coatings, with the second coating having a pore diameter of about 1 to 2 $\mu$. The thus treated carrier may then be connected with a microporous layer. A similarly configured filter is disclosed in DE-OS No. 3,546,328. In the filter of this reference, the substrate is to have an average pore size between about 0.5 $\mu$m and about 10 $\mu$m, while the average pore size of the microporous membrane is to be about 0.1 to 1 $\mu$m. In the examples, the substrate had a pore size of 0.9 $\mu$m and the microporous membrane had a pore size of about 0.08 to 0.3 $\mu$m. However, DE-OS No. 2,440,081, and corresponding U.S. Pat. No. 4,356,215, already mention that an attempt must be made to increase the diameter of the pores of the carriers without enlarging the diameter of the pores of the microporous layer in order to improve the quality of the carrier, i.e. increase its permeability. On the other hand, the pore sizes in these filters are subject to great statistical fluctuations (see page 10, lines 3 et seq. of DE-OS No. 3,546,328), which makes it more difficult to stay within close tolerances.

SUMMARY OF THE INVENTION

It is an object of the present invention to provide a process for manufacturing a filter of the above-type in a way that makes it possible to precisely maintain the distribution and cross-sectional configuration of the pores in the microporous membrane, as well as the geometry of the supporting structure, without statistical fluctuations of the pores according to freely given parameters.

The above object is basically achieved by a method of producing a filter including a microporous membrane having a supporting structure integrally connected to one surface of the membrane, comprising the steps of: producing a mold corresponding to the desired size and shape of the membrane and the supporting structure; forming the membrane and the integrally connected supporting structure by filling the mold with a molding material whose solubility can be changed by high energy radiation, and solidifying the molding material; removing the formed membrane and supporting structure from the mold; and forming micropores in the membrane by irradiating parts of the membrane with high energy radiation and subsequently removing the regions of the membrane having increased solubility.

Preferably, the molding material is a positive resist material and the irradiation of parts of the membrane is effected according to a pattern which corresponds to a given distribution and cross-sectional configuration of the micropores.

According to the preferred embodiment of a filter produced according to the process of the invention defined above, the supporting structure, which is integral with the membrane, includes a plurality of supporting elements extending substantially perpendicular from one surface of the microporous membrane, and the supporting elements of the supporting structure have a mutual spacing of more than 20 $\mu$m with a pore width of the microporous membrane down to 0.2 $\mu$m. Moreover, according to features of the invention, the height of the supporting elements of the filter is a multiple of the thickness of the membrane, the supporting elements may have different heights, and the supporting structure may have a laminar or a honeycomb configuration.

The filters produced in this manner are distinguished by extremely high uniformity with respect to their geometry without resulting in loss of transparency or porosity. Independently of the type of microporous membrane employed, the geometry of the supporting structure as relates to the mutual spacing of the supporting elements and their height and width can be optimally adapted to the respective application-specific requirements, e.g. with respect to flow resistance or mechanical strength.

Independently of this fact, the micropores can be produced in the membrane to correspond to the respective filter engineering requirements although the membrane and the supporting structure form an integral component.

BRIEF DESCRIPTION OF THE DRAWINGS

The invention will be described below in an exemplary manner with reference to the drawings wherein.

DETAILED DESCRIPTION OF THE PREFERRED EMBODIMENTS

Figure 1:
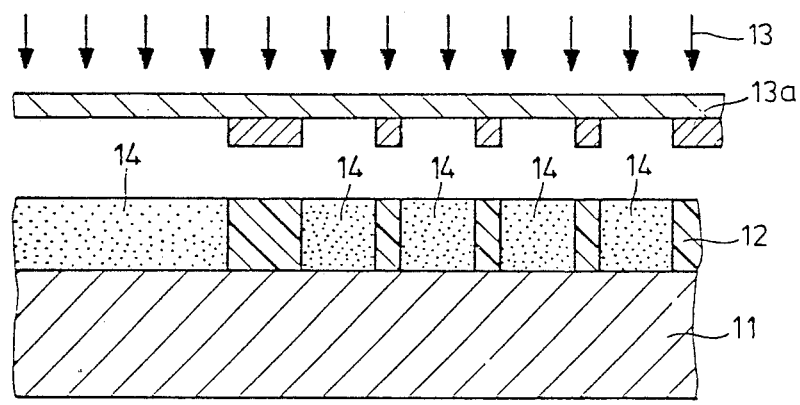
FIGS. 1–8 are schematic cross-sectional views illustrating the successive steps according to the method of the invention for producing an integrated microporous membrane and supporting structure of a microporous membrane filter according to one embodiment of the invention, with FIGS. 1 to 4 illustrating the steps for the production of a mold for the supporting structure for the membrane filter, with FIG. 5 illustrating the shaping and use of the mold of FIG. 4 for the production molding of an integrated membrane and supporting structure, with FIG. 6 illustrating the integrated membrane and supporting structure produced by the molding step of FIG. 5, and with FIGS. 7 and 8 illustrating the production of the micropores in the membrane by partial irradiation of the membrane and the subsequent removal of the irradiated regions having increased solubility.
Figure 2:
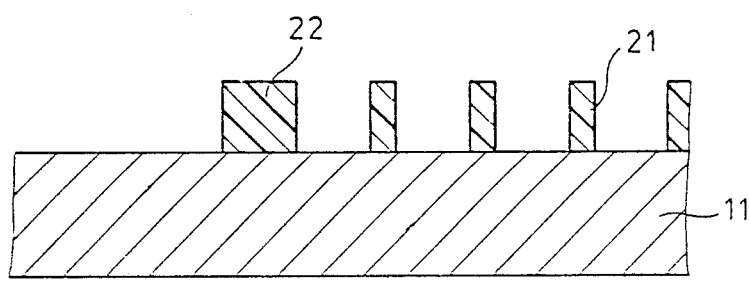

Referring now to FIG. 1, there is shown a plate-shaped galvanic electrode 11 which was initially covered on one major surface with a solid layer 12 of a material whose solubility can be changed by high-energy radiation. Such a material is, for example, a photo resist material and in the illustrated preferred embodiment of the invention is a positive resist material. Following partial irradiation of the layer 12 with X-ray radiation 13 through a mask 13a provided with regions which are relatively positioned and have widths corresponding to the desired supporting structure for the filter, the resist material in the irradiated regions 14 is removed utilizating the increased solubility property of the material of the layer 12 in the regions 14 produced by the radiation. As a result of these irradiation and removal steps, a pattern of forms corresponding to the desired supporting structure is produced on the surface of the galvanic electrode 11 as shown in FIG. 2. As shown, the pattern includes forms 21 corresponding to interior supporting elements of the supporting structure and forms 22 corresponding to supporting elements for the edge reinforcements of the membrane 11.

Figure 3:
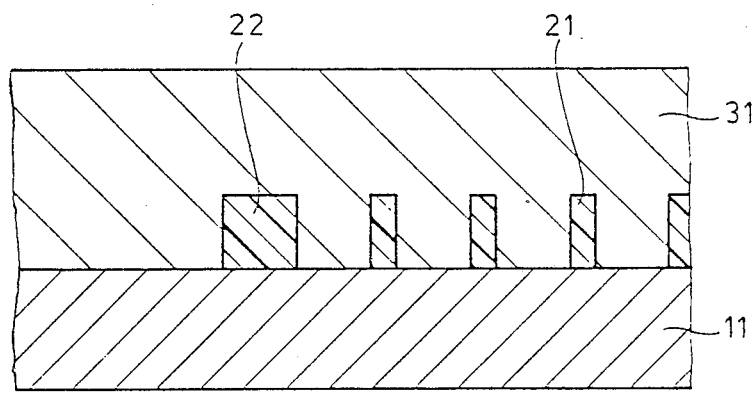
Figure 4:
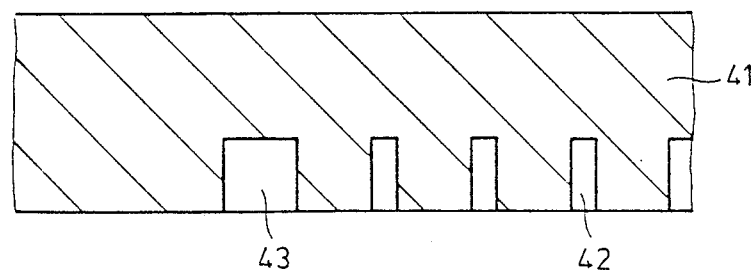

The electrode 11 with the desired forms 21, 22 on its surface is then place in a galvanic bath and, as shown in FIG. 3, a galvanic layer 31 is produced on galvanic electrode 11 until it grows beyond forms 21 and 22 and completely encloses them. Thereafter the galvanic electrode 11 and the forms 21 and 22 are removed from the galvanic layer 31 so that, as shown in FIG. 4, a mold 41 remains which has cavities 42 and 43 for the interior supporting elements and the edge reinforcement elements of the membrane supporting structure.

The galvanic electrode 11 can be removed by dissolution, and in such case is made of a material which dissolves in a solvent or etching medium that does not attack galvanic layer 31. The removal of galvanic electrode 11 is also possible, without destroying it, by carefully pulling galvanic layer 31 from galvanic electrode 11 if the adhesion of galvanic layer 31 has been reduced in a known manner by appropriate pretreatment, e.g. by passivation of galvanic electrode 11.

Figure 5:
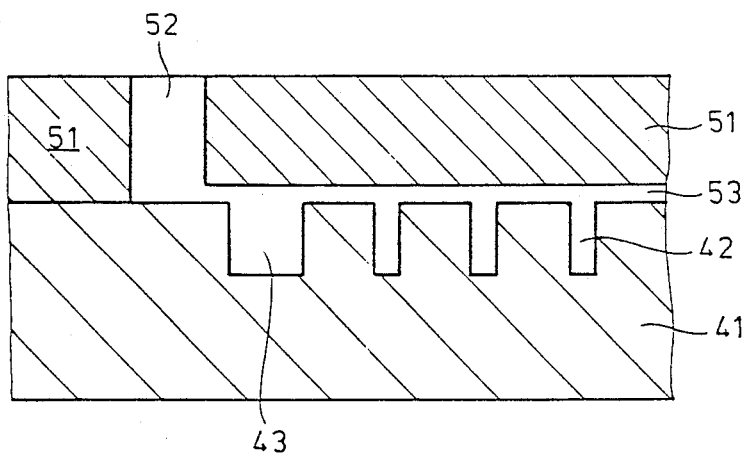

In the next step of the process as shown in FIG. 5, the mold 41 is provided with a cover plate 51 having a recess 53 of a depth corresponding to the thickness of the desired membrane in its surface facing the mold 41, and at least one casting bore 52. After pressing cover plate 51 onto mold 41 in the illustrated position, a closed mold having the desired size and shape of the membrane and the supporting structure is produced via recess 53 in the cover plate 51 and cavities 42 and 43. The closed mold is then filled with a molding mass for the supporting structure and the membrane through the casting bores 52 and the molding mass is allowed to solidify. The molding substance used to fill the mold is a substance whose solubility, after solidification, changes under the influence of high energy, e.g., X-ray, radiation.

Figure 6:
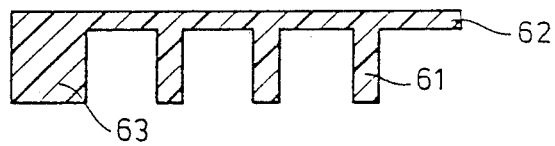
Figure 7:
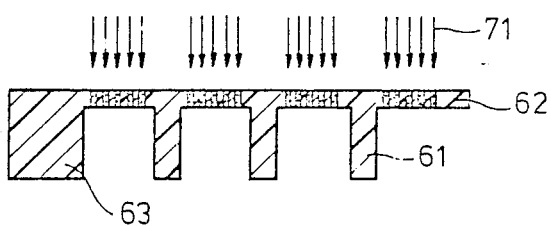
Figure 8:
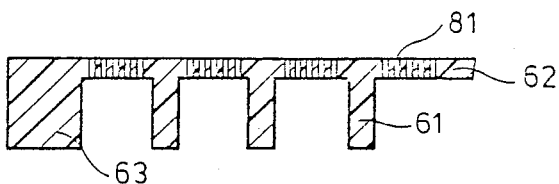

After solidification of the molding mass, the mold parts 51 and 41 are removed and then the casting tail, i.e., the molding mass solidified in casting bore 52, is removed from the solidified mass. Thus, as shown in FIG. 6, a membrane 62 having the desired supporting structure, including interior supporting elements 61 and an edge reinforcement 63, integrally connected thereto, is obtained. Thereafter by partial irradiation of membrane 62 with X-ray radiation 71 (FIG. 7) and subsequent removal of the irradiated regions having higher solubility, micropores 81 are produced in membrane 62 according to the given distribution and crosssectional configuration as shown in FIG. 8. The irradiation is effected through an X-ray mask permeable to X-ray radiation in a pattern corresponding to the distribution and cross-sectional configuration of the micropores.

Figure 9:
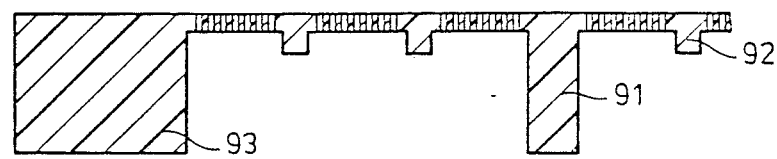
FIG. 9 is a schematic cross-sectional view illustrating a further embodiment of the supporting structure of the membrane of the filter according to the invention.

The supporting elements 61 of the supporting structure may be arranged, for example, in the manner of laminae or in a honeycomb pattern, all of the same height. Alternatively, the supporting structure may be optimized for the specific application according to mechanical and flow engineering aspects and may be constructed, for example as shown in FIG. 9, with high and wide supporting elements 91 and edge reinforcements 93, and lower and thinner supporting elements 92, similarly to light-weight structural materials. With such an arrangement, unmolding is facilitated since the particularly thin elements 92 also have a low height.

The thus produced membranes and integrated supporting structure after providing micropores in the membrane as described below, may, of course, also be used as a carrier for a further microporous membrane.

The spacing between parallel walls of adjacent supporting elements is, for example, 80 $\mu$m with a wall thickness of about 20 $\mu$m. Independently of this, the pore width of the microporous membrane 62 may be 0.2 to 2 $\mu$m, with the pores 81 being spaced very close together and with a membrane thickness of about 5 $\mu$m. The height of the supporting elements 61, 63 may be up to 500 $\mu$m. The material employed for the galvanic electrode 11 may be copper, for example, and the material for the galvanically produced mold part 41 may be nickel, for example. Of course, the mold can also be produced in other known manufacturing processes, for example by sinking electrical discharge machining (EDM).

The molding substance 12 is preferably composed of a casting resin based on methacrylate to which is added an internal release agent to facilitate unmolding. The polymethyl methacrylate (PMMA) formed upon solidification of the molding mass is a molding substance which has the characteristics of a positive resist material.

It will be understood that the above description of the present invention is susceptible to various modifications, changes and adaptations, and the same are intended to be comprehended within the meaning and range of equivalents of the appended claims.

What is claimed is:

1. A microporous membrane filter comprising: an integrally molded body of a material whose solubility can be changed by high energy radiation and including a first flat membrane portion and a plurality of supporting elements for said membrane portion extending from one surface of said membrane portion; and a plurality of micropores provided in selected regions of said membrane portion and formed by high energy irradiation of the membrane and removal of the regions of increased solubility.

2. A method of producing a filter including a microporous membrane having a supporting structure integrally connected to some portions of one surface of the membrane, comprising the steps of:
   (a) producing a mold corresponding to the desired size and shape of said membrane and said supporting structure;
   (b) forming the membrane and the integrally connected supporting structure by filling the mold with a molding material whose solubility can be changed by high energy radiation, and solidify the molding material;

(c) removing the formed membrane and supporting structure from the mold; and (d) forming micropores in the membrane by:
  irradiating with high energy radiation parts of the membrane at which corresponding portions of the one surface are not connected to the supporting structure, and
  subsequently removing the regions of the membrane having higher solubility.

3. A method as defined in claim 1, wherein: said molding material is a positive resist material; and the irradiating of parts of the membrane is effected according to a pattern which corresponds to a given distribution and cross-sectional configuration of the micropores.

4. A filter produced according to the process defined claim 1.

5. A filter according to claim 4, wherein: the supporting structure includes a plurality of supporting elements extending substantially perpendicular from one surface of the porous membrane; and the supporting elements of the supporting structure have a mutual spacing of more than 20 $\mu$m with a pore width of the microporous membrane down to 0.2 $\mu$m.

6. A filter as defined in claim 5, wherein the height of the supporting elements is a multiple of the thickness of the membrane.

7. A filter as defined in claim 6, wherein the supporting elements have different heights.

8. A filter as defined in claim 6, wherein the supporting structure has a laminar or a honeycomb configuration.

9. A filter as defined in claim 5, wherein the supporting structure have a laminar or honeycomb configuration.

* * * * *